(12) United States Patent
Miura et al.

(10) Patent No.: US 7,214,973 B2
(45) Date of Patent: May 8, 2007

(54) SEMICONDUCTOR DEVICE AND METHOD OF MANUFACTURING THE SAME

(75) Inventors: Makoto Miura, Kokubunji (JP); Katsuyoshi Washio, Tokorozawa (JP); Hiromi Shimamoto, Iruma (JP)

(73) Assignee: Hitachi, Ltd., Tokyo (JP)

( * ) Notice: Subject to any disclaimer, the term of this patent is extended or adjusted under 35 U.S.C. 154(b) by 254 days.

(21) Appl. No.: 11/070,229

(22) Filed: Mar. 3, 2005

(65) Prior Publication Data

US 2006/0043418 A1    Mar. 2, 2006

(30) Foreign Application Priority Data

Aug. 31, 2004  (JP) .............................. 2004-251535

(51) Int. Cl.
- H01L 31/0328 (2006.01)
- H01L 31/0336 (2006.01)
- H01L 31/072 (2006.01)
- H01L 31/109 (2006.01)

(52) U.S. Cl. ........................................ 257/197; 257/565
(58) Field of Classification Search ................ 257/197, 257/565

See application file for complete search history.

(56) References Cited

U.S. PATENT DOCUMENTS 5,962,880 A * 10/1999 Oda et al. .................... 257/198

2005/0236647 A1 * 10/2005 Khater ........................ 257/197

FOREIGN PATENT DOCUMENTS

| JP | 07-147287 | 6/1995 |
|---|---|---|
| JP | 10-079394 | 3/1998 |
| JP | 2002-359249 | 12/2002 |

* cited by examiner

Primary Examiner—Phat X. Cao
(74) Attorney, Agent, or Firm—Antonelli, Terry, Stout & Kraus, LLP.

(57) ABSTRACT

A bipolar type semiconductor device capable of attaining high current gain and high cut-off frequency and performing a satisfactory transistor operation also in a high current region while maintaining a high breakdown voltage performance, as well as a method of manufacturing the semiconductor device, are provided. In a collector comprising a first semiconductor layer and a second semiconductor layer narrower in band gap than the first semiconductor layer, an impurity is doped so as to have a peak of impurity concentration within the second collector layer and so that the value of the peak is higher than the impurity concentration at any position within the first collector layer. It is preferable to adjust the concentration of the doped impurity in such a manner that a collector-base depletion layer extends up to the first collector layer.

14 Claims, 13 Drawing Sheets

SEMICONDUCTOR DEVICE AND METHOD OF MANUFACTURING THE SAME

CLAIM OF PRIORITY

The present application claims priority from Japanese application JP 2004-251535 filed on Aug. 31, 2004, the content of which is hereby incorporated by reference into this application.

BACKGROUND OF THE INVENTION

1. Field of the Invention

The present invention relates to a semiconductor device, especially a bipolar transistor, and a method of manufacturing the same.

2. Description of the Prior Art

Recently, bipolar transistors and integrated circuits with bipolar transistors mounted thereon have been utilized in various application fields. The bipolar transistor is advantageous over the field effect transistor in terms of high speed performance and high breakdown voltage performance, and its application is expanded for communication devices, storage systems, etc. Conventional examples of a bipolar transistor capable of attaining high speed and high breakdown voltage include a silicon-germanium heterobipolar transistor using the selective epitaxial technique (Patent Literature 1). FIG. 3A and FIG. 3B show the distribution of impurities (FIG. 3B) and that of germanium (FIG. 3A) in a principal portion of a conventional transistor. In both FIGS. 3A and 3B, the axes of abscissa are illustrated in a correlative manner to make it easy to understand how Ge distribution and impurity concentration are correlated with each other. In the drawings, the impurity concentration of a low concentration collector layer is adjusted depending on the purpose of use of a transistor. More particularly, in the case of a transistor aiming at a high speed, a high concentration is attained by, for example, ion implantation, while in the case of a transistor for which a high voltage resisting characteristic is important, a low concentration is ensured. The distribution of germanium is designed so as to cover the base region, and a heterointerface comprising a silicon/silicon-germanium junction is formed in the vicinity of an emitter-base junction. In a heterobipolar transistor, a change of a forbidden band at a hetero interface in the vicinity of an emitter-base junction restricts a hole current flowing from base to emitter and brings about the effect of improving the current gain. On the other hand, on the collector side, it is likely that the aforesaid change of the band gap will obstruct the transistor operation, and therefore the heterointerface is designed so as to be spaced a certain distance from a collector-base junction. If the heterointerface is present near the collector-base junction, there is a great possibility that the heterointerface may be positioned within a p-type base layer under the influence of base impurity diffusion caused by heat treatment or the like during the formation of a transistor. In this case, all discontinuous quantity of the band gap appears as barrier in a conduction band, greatly impeding the conduction of electrons, with a consequent great decrease of the current amplification factor and deterioration in high-speed operation of the transistor. In the case of an npn-type bipolar transistor using silicon-germanium, if a heterointerface is present sufficiently on the collector side rather than collector-base junction, all discontinuous quantity of the band gap appears on a valence band side and therefore the above-mentioned problem does not arise in at least a low current operation. However, also in the conventional heterobipolar transistor thus designed, there still exists the problem that the influence of a heterointerface on the collector side greatly impedes the transistor operation in the case where a high current operation is needed. FIG. 4 is an energy band diagram in low and high current operations of a conventional npn-type heterobipolar transistor. A concrete construction of npn heterojunction is shown in the upper portion of the figure. Usually, when a high current is applied to an npn-type transistor, many electrons are accumulated in collector-base junction which is attributable to a finite carrier speed, canceling a fixed charge in a depletion layer in the junction. This phenomenon causes an increase of the base width, i.e., Kirk effect. However, in the case of a bipolar transistor having a heterointerface also on the collector side, the heterointerface and the collector-base junction approach each other upon occurrence of Kirk effect and the foregoing conduction band barrier occurs in the heterointerface and greatly impedes the transistor operation. FIGS. 5 and 6 schematically show collector current dependence of current gain and cut-off frequency respectively of a heterobipolar transistor. In both figures, the axes of abscissa represent collector current and the axes of ordinate represent current gain (FIG. 5) and cut-off frequency (FIG. 6). In each figure, a thin line characteristic is of Si BJT and a thick line characteristic is of SiGe HBT. Further, the value of collector current usually employed is shown as "working current (current of use)." As shown in the figures, in the heterobipolar transistors, an abrupt lowering of current gain and that of cut-off frequency are observed and thus transistor characteristics are deteriorated in comparison with the ordinary type of bipolar transistors. The lower the collector impurity concentration, the more conspicuous this phenomenon. This phenomenon is apt to occur particularly in a transistor which aims at attaining a high breakdown voltage. As shown in the figures, satisfactory characteristics are not obtainable in the vicinity of the working current.

[Patent Literature 1]
  Japanese Patent Laid-Open No. Hei 10-79394

SUMMARY OF THE INVENTION

As described above, in what is called a double heterobipolar transistor having two heterointerfaces, the deterioration of transistor characteristics in the application of a high current has been an unavoidable problem. The occurrence of a barrier in the conduction band may be avoided by increasing the collector impurity concentration or thickening the silicon-germanium layer on the collector side or increasing the distance between heterointerface and collector-base junction. However, an increase of collector concentration causes a lowering of breakdown voltage and an increase in thickness of the silicon-germanium layer is likely to cause crystal defect due to accumulation of strain. Thus, any of those methods cannot be the best solution.

The present invention has been made in view of the above-described problems. It is an object of the present invention to provide a semiconductor device, especially a heterobipolar transistor having a high breakdown voltage characteristic and requiring operation in a high current region, which can avoid the occurrence of a barrier in a conduction band while maintaining a high breakdown voltage and which permits a transistor operation in a high current region, as well as a method of manufacturing the semiconductor device.

The semiconductor device according to the present invention comprises a first semiconductor layer of a first conductive type embedded in a semiconductor substrate, a second semiconductor layer of the first conductive type formed on the first semiconductor layer, a third semiconductor layer of the first conductive type formed on the second semiconductor layer and made of a material smaller in band gap than the second semiconductor layer, a fourth semiconductor layer of a second conductive type formed on the third semiconductor layer, and a fifth semiconductor layer of the first conductive type formed on the fourth semiconductor layer, wherein an impurity concentration distribution in the third semiconductor layer has a peak of concentration within the third semiconductor layer, the value of the peak being higher than the impurity concentration in the second semiconductor layer.

A bipolar transistor including the first semiconductor layer as a collector embedded layer, the second and third semiconductor layers as collector layers, the fourth semiconductor layer as a base layer, and the fifth semiconductor layer as an emitter is a typical and concrete semiconductor device according to the present invention. In this case, a collector-base depletion layer formed by junction of the third and fourth semiconductor layers preferably extends up to the second semiconductor layer. Most preferably, the third semiconductor layer has within the layer a region wherein the band gap changes gently, and the closer to the second semiconductor layer, the larger the band gap.

In the above semiconductor device according to the present invention, the first and second semiconductor layers may be formed of single crystal silicon, the third and fourth semiconductor layers may be formed of single crystal silicon-germanium or single crystal silicon-germanium-carbon, and the fifth semiconductor layer may be formed of single crystal silicon or single crystal silicon-germanium or single crystal silicon-germanium-carbon.

A semiconductor device manufacturing method according to the present invention comprises the steps of embedding a first conductive type impurity at a high concentration into a semiconductor substrate to form a first semiconductor layer; forming a second semiconductor layer of the first conductive type onto the first semiconductor layer; forming on the second semiconductor layer a third semiconductor layer of the first conductive type made of a material smaller in band gap than the second semiconductor layer; forming a fourth semiconductor layer of a second conductive type onto the third semiconductor layer; and forming a fifth semiconductor layer of the first conductive type onto the fourth semiconductor layer. When doping the first conductive type impurity into the third semiconductor layer, a peak of concentration appears within the third semiconductor layer, and the value of the peak is higher than the impurity concentration of the second semiconductor layer. The doping of the first conductive type impurity into the third semiconductor layer is preferably conducted by an ion implantation method which affords a controlled impurity distribution. The doping of the first conductive type impurity into the third semiconductor layer may be done simultaneously with the formation of the third semiconductor layer.

According to the present invention it is possible to provide a heterobipolar transistor capable of suppressing an abrupt lowering of current gain and cut-off frequency in the application of a high current while maintaining a high breakdown voltage performance of the transistor.

BRIEF DESCRIPTION OF THE DRAWINGS

FIGS. 15A and 14B illustrate the distribution of germanium and the distribution of impurities in a semiconductor device according to a fourth embodiment of the present invention, respectively;

DETAILED DESCRIPTION OF PREFERRED EMBODIMENTS

Preferred embodiments of the present invention are characterized in that, in a heterobipolar transistor having a silicon-germanium layer, the collector impurity concentration has a peak within an n-type silicon-germanium layer and that the value of the peak is higher than the collector impurity concentration in an n-type silicon layer. Further, during operation of the transistor, a collector-base depletion layer on the collector side extends up to the n-type silicon layer and the transistor has a high breakdown voltage. In the present invention, the occurrence of a barrier in a conduction band can be delayed by providing a high concentration impurity region in a collector layer located on the base side rather than heterojunction, and a satisfactory transistor operation can be ensured in a higher current. Further, a lowering in breakdown voltage of the transistor is prevented by limiting a high concentration collector region.

Concrete embodiments of the semiconductor device and the method of manufacturing the same according to the present invention will be described below with reference to the accompanying drawings.

<First Embodiment>

Figure 1A:
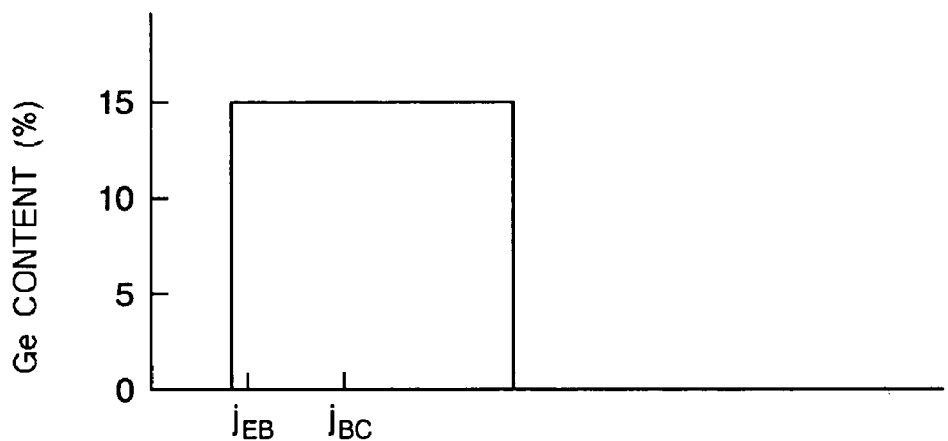
FIGS. 1A and 1B illustrate the distribution of germanium and the distribution of impurities in a semiconductor device according to a first embodiment of the present invention, respectively.
Figure 1B:
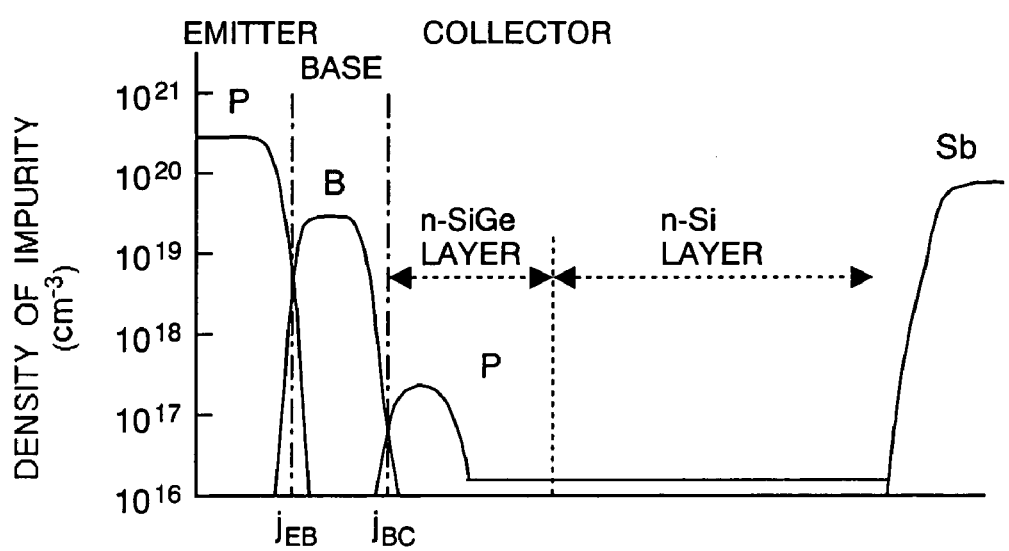

FIG. 1A and FIG. 1B illustrate the distribution of impurities (FIG. 1B) and germanium (FIG. 1A) in a principal portion of a semiconductor device according to a first embodiment of the present invention. The axes of abscissa in FIGS. 1A and 1B are shown in a correlated manner to facilitate understanding of a correlation between Ge distribution (Ge content) and impurity concentration (density of impurity). Silicon-germanium layer is distributed so as to cover a p-type base, and a heterointerface between silicon layer and silicon-germanium layer is disposed near the junction of n-type emitter and p-type base. A heterointerface on the collector side is disposed at a predetermined distance from the junction of n-type collector and p-type base, and a low concentration collector region is formed by two layers which are an n-type silicon-germanium layer and an n-type silicon layer. Phosphorus as n-impurity is distributed so as to have a peak near the collector-base junction in the n-type silicon-germanium layer, and the phosphorus concentration at the peak is set so as to be higher than the impurity concentration in any region. For example, the peak position in the aforesaid n-type impurity distribution is set so as to fall under the range on p-type base side from the central position of the n-type silicon-germanium layer. Further, the phosphorus concentration peak value and impurity distribution width are designed so as to keep a lowering of breakdown voltage to a minimum while taking into account a current value required during use of the transistor and both current gain and cut-off frequency required at that current. It is assumed that during operation of the transistor a collector-base depletion layer always extends up to the interior of n-type silicon layer.

Figure 7:
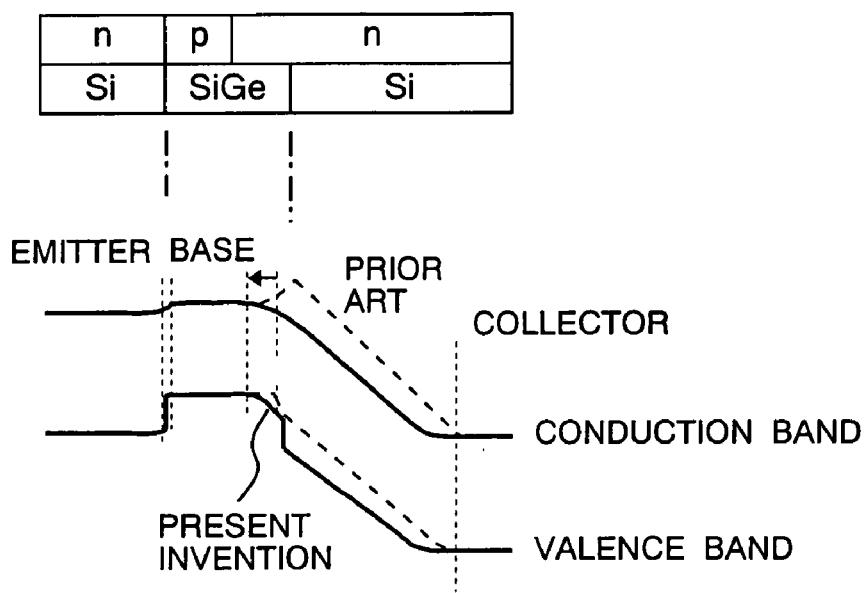
FIG. 7 illustrates the effect of the present invention in terms of an energy band diagram.
Figure 8:
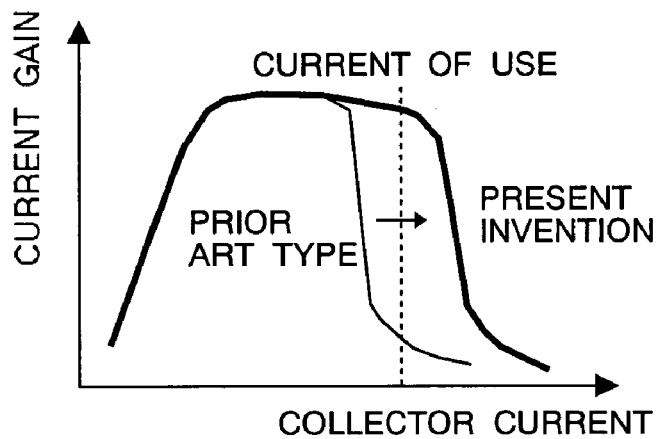
FIG. 8 illustrates in comparison with a conventional example what effect is obtained in the present invention in current amplification factor vs. operating current.
Figure 9:
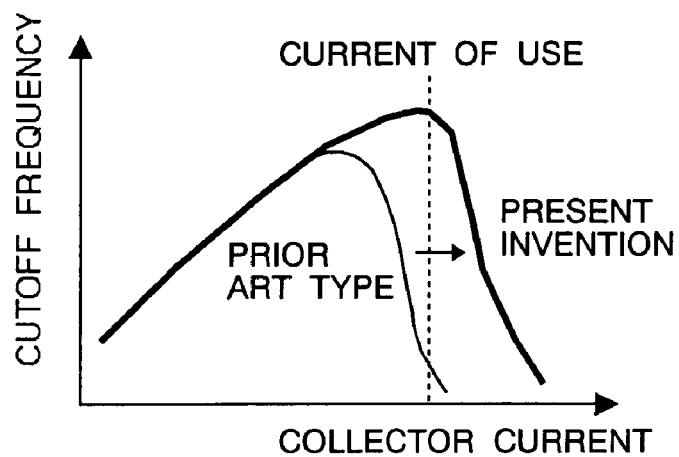
FIG. 9 illustrates in comparison with a conventional example what effect is obtained in the present invention in cut-off frequency vs. operating current.

In the transistor thus designed, electrons accumulated by the application of a high current are compensated by phosphorus which is doped at a high concentration in a certain region, and therefore the occurrence of Kirt effect can be delayed. FIG. 7 is an energy band diagram in low and high current operations of the npn-type heterobipolar transistor according to this embodiment. A concrete construction of npn hetero junction is shown schematically in the upper portion of the figure. As shown in FIG. 7, even in a current region where an energy barrier has occurred in the prior art (Conventional Example), it is possible to suppress the occurrence of the energy barrier and maintain high current gain and cut-off frequency up to a higher current. This will be understood from the characteristics shown in FIGS. 8 and 9. FIGS. 8 and 9 schematically illustrate a collector current dependence of current gain and cut-off frequency respectively in the heterobipolar transistor according to the present invention. In both figures, the axes of abscissa represent a collector current and the axes of ordinate represent current gain in FIG. 8 and cut-off frequency in FIG. 9. In each of the figures, a thin line characteristic is of Si BJT and a thick line characteristic is of SiGe HBT. A collector current value usually employed is shown as "current of use (working current)." According to the present invention, even in the working current, satisfactory characteristics are ensured in both current gain and cut-off frequency.

Figure 2:
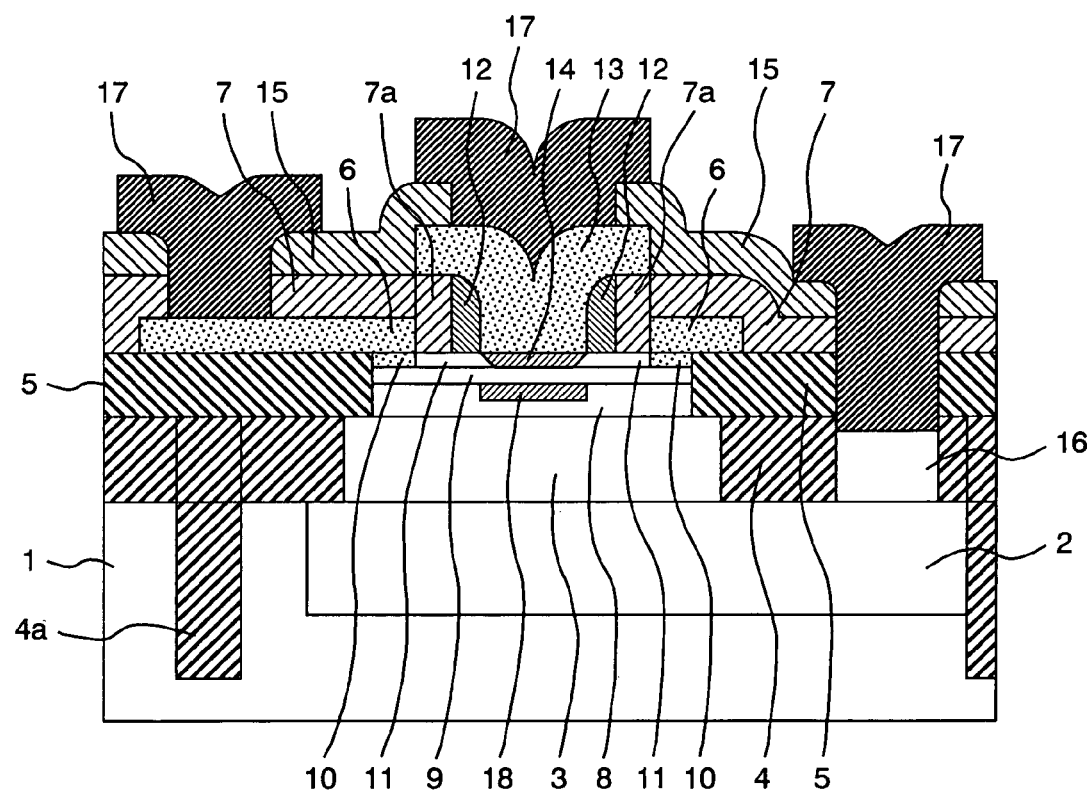
FIG. 2 is a sectional view of the semiconductor device of the first embodiment.
Figure 3A:
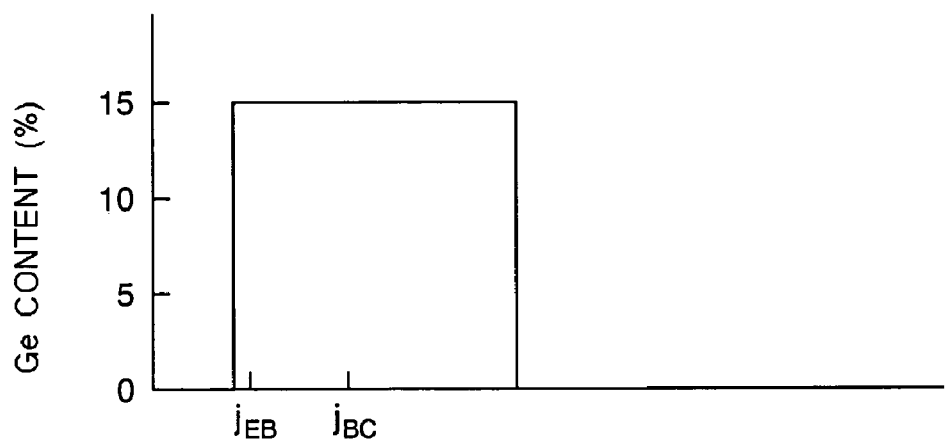
FIGS. 3A and 3B illustrate the distribution of germanium and the distribution of impurities in a conventional bipolar transistor, respectively.
Figure 3B:
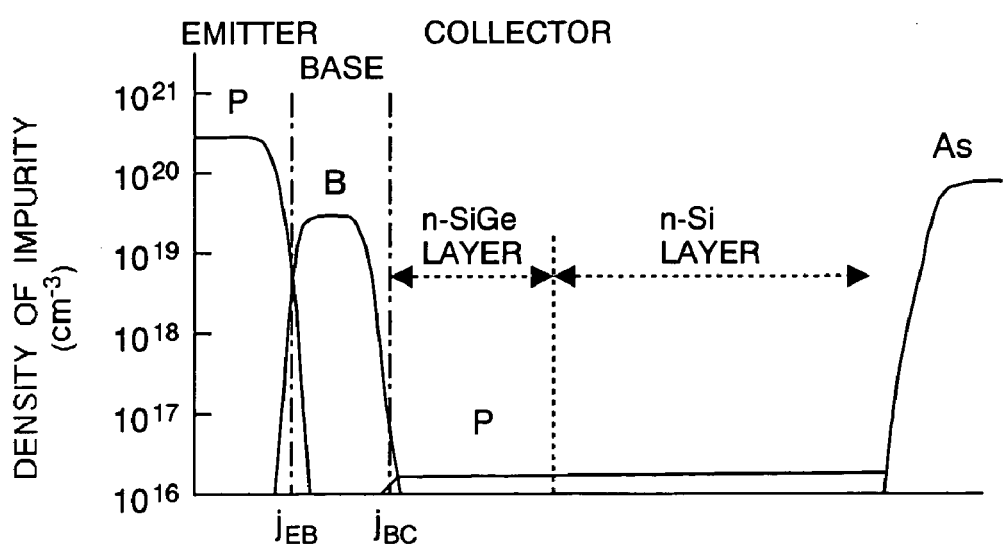
Figure 4:
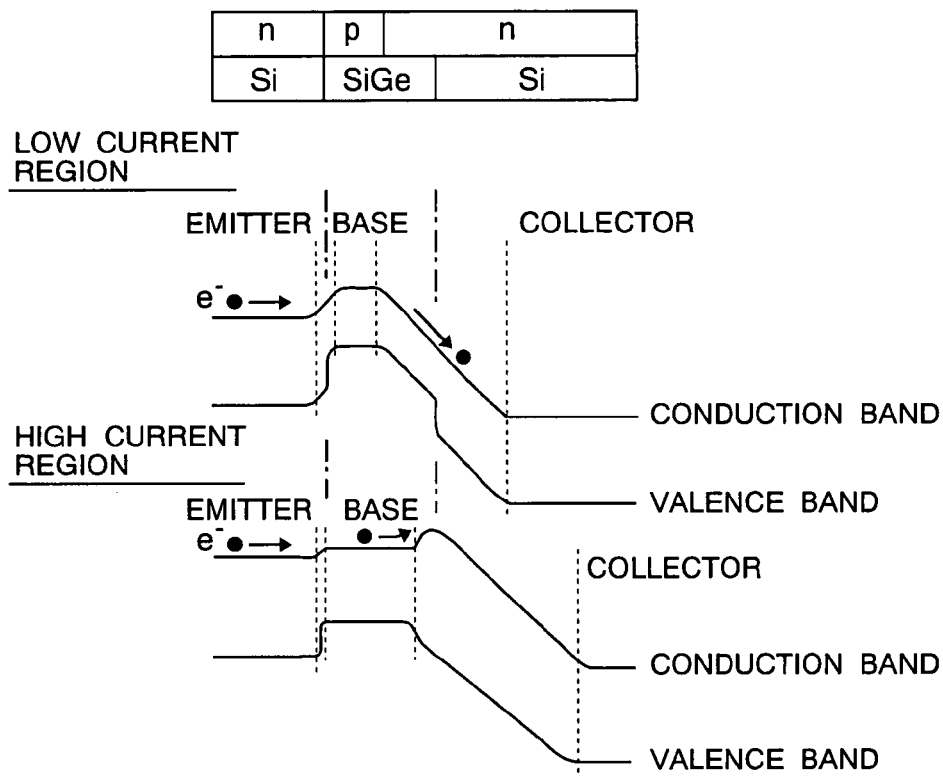
FIG. 4 is an energy band diagram during operation of a conventional bipolar transistor.
Figure 5:
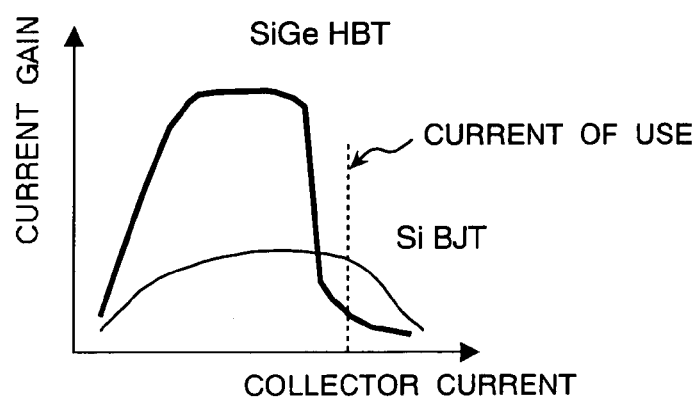
FIG. 5 illustrates a relation between current amplification factor and operating current in the conventional bipolar transistor.
Figure 6:
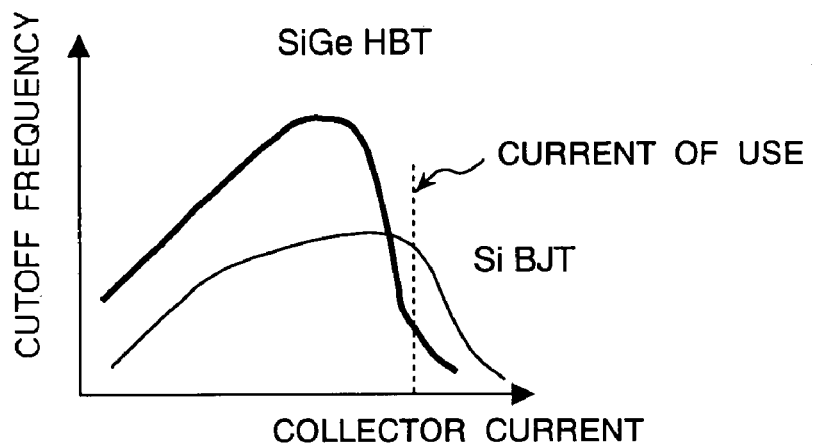
FIG. 6 illustrates a relation between cut-off frequency and operating current in the conventional bipolar transistor.

FIG. 2 shows a sectional structure of a principal portion of the semiconductor device of this embodiment. An n-type collector embedded layer 2 of a high concentration is present within a p-type silicon substrate 1. An n-type silicon layer 3 of a low concentration is formed on the embedded layer 2 to constitute a collector layer. It is preferable that the thickness of the collector layer be about 1 μm. Within an opening surrounded by an insulating film 5 there are formed an n-type silicon-germanium layer 8 of a low concentration, a p-type silicon-germanium layer 9 and an n-type silicon or silicon-germanium layer 15, constituting collector, base, and emitter layers, respectively. In the n-type silicon-germanium layer 8 of a low concentration there exists a region 18 doped with n-type impurity, through an ion implantation method, having such a distribution as shown in FIG. 1.

Next, a concrete method of manufacturing the semiconductor device according to this embodiment will be described below with reference to FIGS. 2 and 10.

Figure 10A:
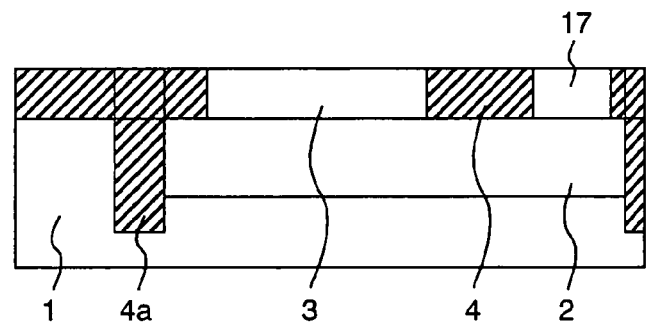
FIGS. 10A to 10D is sectional views showing a method of manufacturing the semiconductor device of the first embodiment.

First, arsenic or antimony as n-type impurity is added to a region as part of the silicon substrate 1 by the ion implantation method and thereafter an n-type collector embedded layer 2 of a high concentration (the first semiconductor layer of the first conductive type in the foregoing general description) is formed by thermal diffusion. Subsequently, a first collector layer 3 (the second semiconductor layer of the first conductive type in the foregoing general description) formed of n-type single crystal silicon of a low concentration is deposited by epitaxial growth. Further, insulating films 4 and 4a are formed selectively except a transistor-forming region and a collector lead-out electrode region to effect element isolation (FIG. 10A). The element isolation structure may be formed by forming an n-type silicon layer of a low concentration on the silicon substrate 1 by the epitaxial growth method and oxidizing the n-type silicon layer of a low concentration selectively except the first collector region 3 and the collector lead-out electrode region indicated at 17. Alternatively, the element isolation structure may be formed by shaving the element isolation region by lithography after formation of the n-type silicon layer of a low concentration, then embedding insulating films 4 and 4a and planalizing the surface by chemical mechanical polishing (CMP) for example. Further, there may be adopted a method involving depositing insulating films 4 and 4a on the silicon substrate, forming an opening and thereafter forming the first collector region 3 and collector lead-out electrode region 16 within the opening selectively by epitaxial growth for example.

Figure 10B:
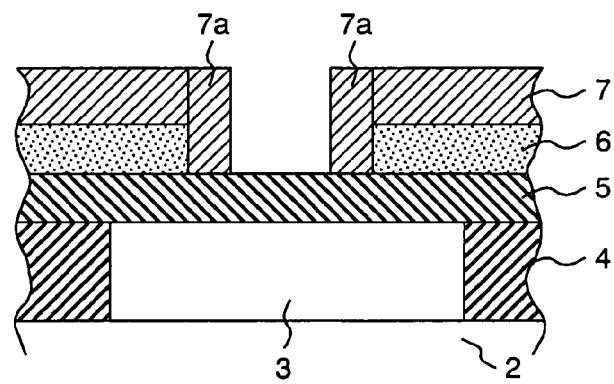

Then, an insulating film 5, a base lead-out electrode 6 of p-type polycrystalline silicon of a high concentration or p-type polycrystalline silicon-germanium of a high concentration, and an insulating film 7, are formed throughout the whole surface. The p-type impurity of the base lead-out electrode may be injected by the ion implantation method or may be added at the time of the deposition. Subsequently, an opening is formed by both lithography and dry etching into the multi-layer film comprising the base electrode 6 and the insulating film 7. Further, by depositing an insulating film and performing drying etching, an emitter-base isolation insulator 7a is formed within the opening (FIG. 10B). In FIGS. 10B and 10D there is shown a structure above the first collector region 3. The lower structure is the same as in FIG. 10A.

Thereafter, the insulating film 5 is etched selectively to partially open the portion below the base electrode 6 and provide collector- and base-forming regions. In this process, it is preferable to use, for example, a silicon nitride film as the insulating film 5 and silicon oxide films as the insulating films 7 and 7a. In this case, by using phosphoric acid held at 80° C., the insulating film 5 is etched selectively relative to the insulating films 7 and 7a, affording the structure shown in FIG. 10C.

Figure 10C:
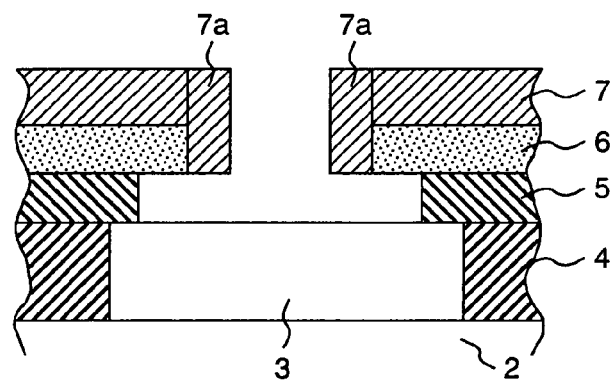
Figure 10D:
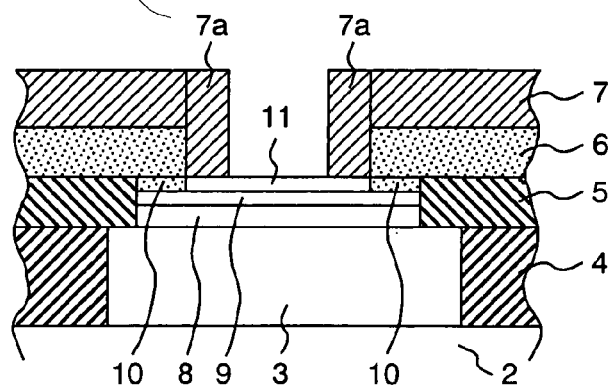

Next, a second n-type collector layer 8 of a low concentration (the third semiconductor layer of the first conductive type in the foregoing general description) formed of single crystal silicon-germanium, a p-type base layer 9 (the fourth semiconductor layer of the second conductive type in the foregoing description) formed of single crystal silicon-germanium, and a single crystal silicon layer 11 of a low concentration (the fifth semiconductor layer of the first conductive type in the foregoing general description), are deposited 30–40 nm, 1–10 nm, and 5–20 nm, respectively, on the first collector layer 3 shown in FIG. 10C each by selective epitaxial growth (FIG. 10D). At this time, a p-type external base layer 10 of polycrystalline silicon-germanium is formed below the base electrode 6 simultaneously with the base layer 9. In this case, a growth technique is used wherein the growth of polycrystalline silicon-germanium below the base electrode 6 does not take place during growth of the second collector layer 3, but take place after the growth of the base layer 9. This technique utilizes the difference between the growth start time of single crystal silicon (silicon-germanium) onto single crystal silicon (silicon-germanium) and the growth start time of polycrystalline silicon (silicon-germanium) onto polycrystalline silicon (silicon-germanium). This is peculiar to the gas source Molecular Beam Epitaxy (MBE) method and Chemical Vapor Deposition (CVD) method. In particular, the CVD method is superior in controllability and affords good conditions under the growth conditions of a pressure of 100 Pa or lower and a temperature of 500° to 700° C. Now, phosphorus as n-type impurity is doped through the opening shown in FIG. 10D by the ion implantation method. In this way there is formed an n-type impurity region 18 having a concentration peak within the n-type silicon-germanium layer and having such a distribution as shown in FIG. 1. Then, after deposition of an insulating film throughout the whole, an emitter-base isolation insulator 12 is formed by dry etching and the opening is buried with an emitter electrode 13 of n-type polycrystalline silicon of a high concentration. Subsequently, heat treatment is performed, causing n-type impurity to be diffused from the emitter electrode, whereby an emitter region 14 is formed within the single crystal silicon layer 11. Thereafter, the base lead-out electrode 6 and the emitter electrode 13 are subjected to patterning. Oxide film 15 is deposited throughout the whole surface, openings are formed in the regions of base lead-out electrode 6, emitter electrode 13 and collector lead-out electrode 16, and electrodes 17 are formed (FIG. 2).

What is important in this embodiment is to implant impurity at the time of impurity doping by ion implantation in such a manner that the phosphorus impurity distribution has a peak value at an appropriate concentration within the n-type silicon-germanium layer and adjust both energy and dope quantity. The impurity distribution is set in view of the correlation between the required voltage resistance and transistor characteristics in a high current region where the transistor is actually used. In this embodiment, a feature resides in that the phosphorus doped region 18 is formed in only a limited region within the n-type silicon-germanium layer 11. The expanse of the depletion layer around the region 18 is kept large and a lowering of breakdown voltage caused by an increase of the collector impurity concentration is kept to a minimum.

<Second Embodiment>

Figure 11A:
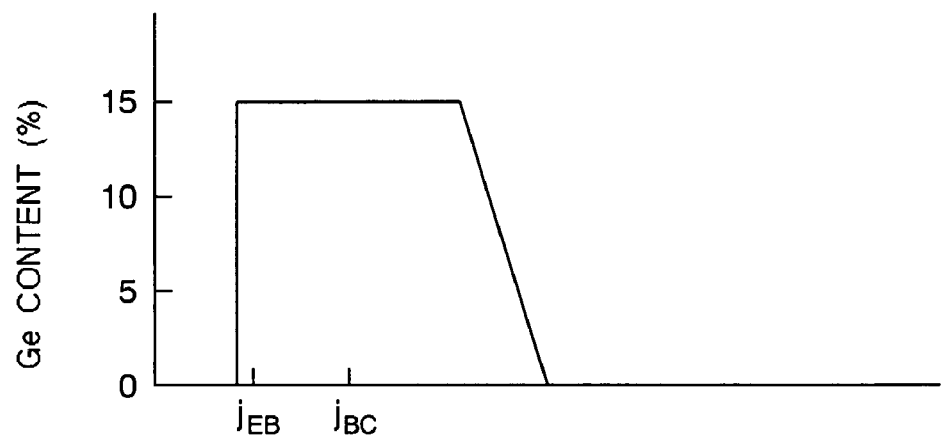
FIGS. 11A and 11B illustrate the distribution of germanium and the distribution of impurities in a semiconductor device according to a second embodiment of the present invention, respectively.
Figure 11B:
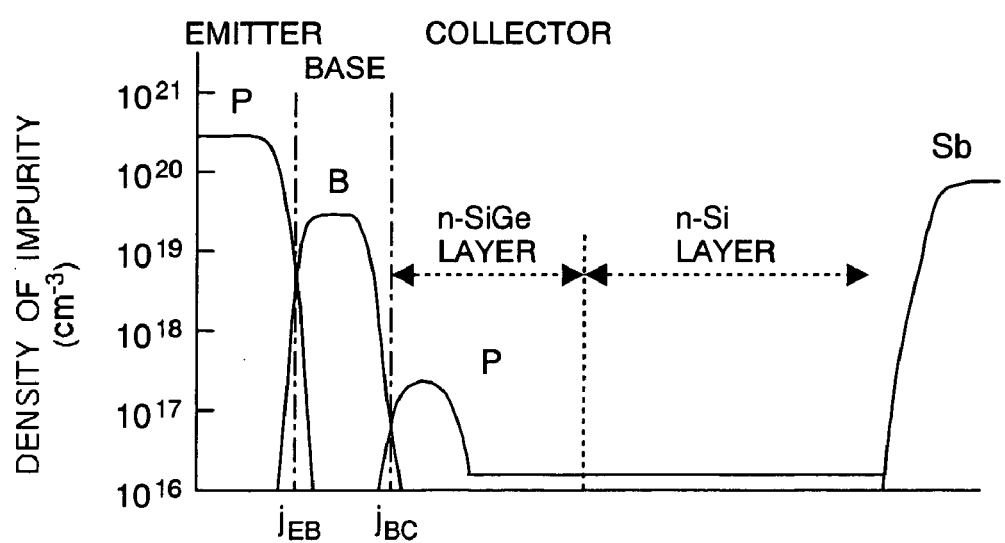
Figure 12:
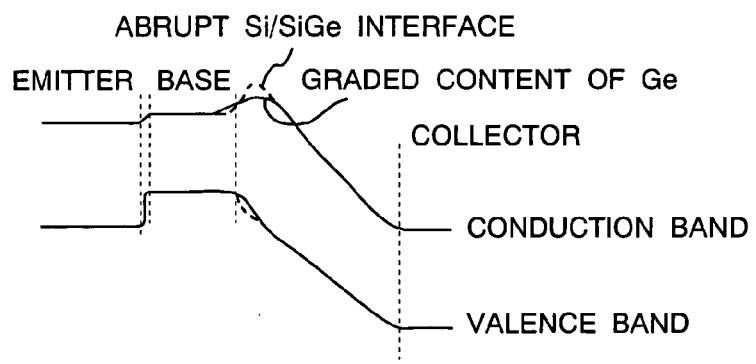
FIG. 12 is an energy band diagram illustrating the effect of the semiconductor device of the second embodiment.

FIGS. 11A and 11B shows the distribution of germanium and the distribution of impurities, respectively, in a semiconductor device according to a second embodiment of the present invention. In this embodiment, the germanium composition in a silicon-germanium layer is set so as to decrease gradually from a certain position toward the boundary between it and an n-type silicon layer as shown in the figure. For example, in the case where the thickness of the n-type silicon-germanium layer is 30 to 40 nm, the germanium composition may be changed in the region of about 10 nm from the said boundary. The silicon-germanium layer having such a composition distribution does not have a steep heterointerface between it and the n-type silicon layer, thus diminishing the barrier itself which occurs in the conduction band as in FIG. 12. FIG. 12 shows a schematic band structure in the case of a steep Si/SiGe interface as indicated by dotted lines. In contrast therewith, the band structure indicated by solid lines does not have a steep heterointerface, whereby good transistor characteristics, i.e., high current gain and cut-off frequency, can be obtained up to a still higher current region. The distribution of phosphorus within the n-type silicon-germanium layer in this embodiment may be set as in the first embodiment.

<Third Embodiment>

Figure 13:
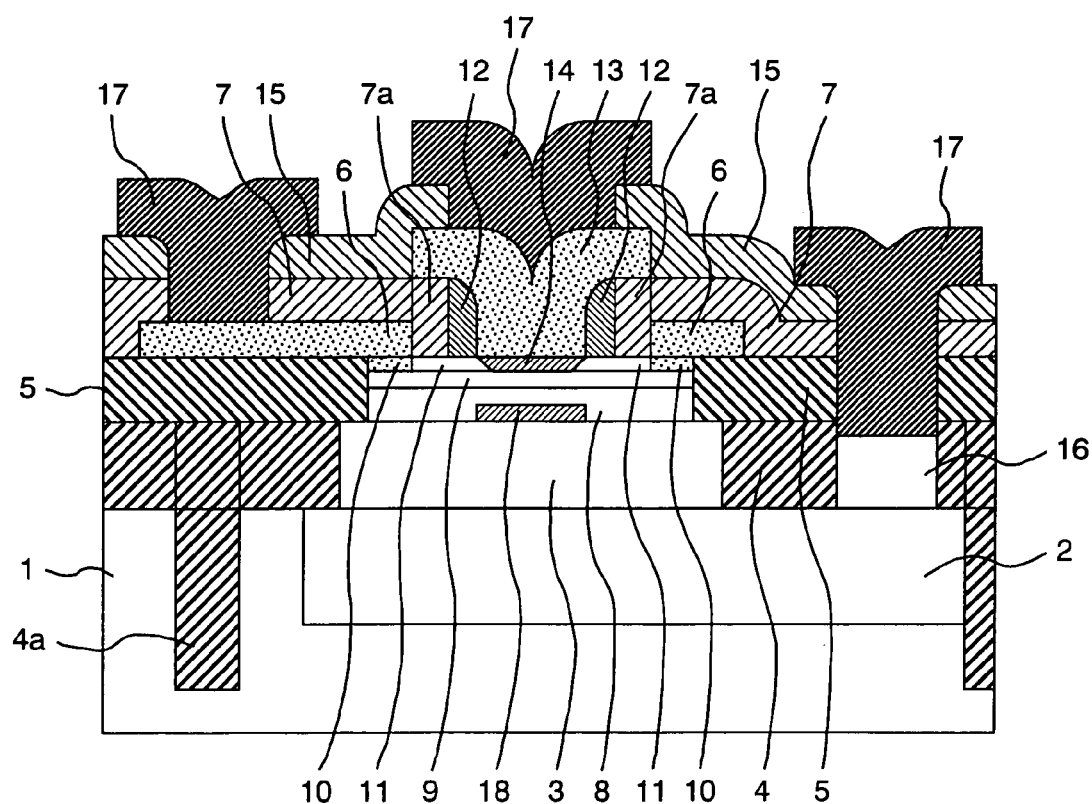
FIG. 13 is a sectional view of a semiconductor device according to a third embodiment of the present invention.
Figure 14A:
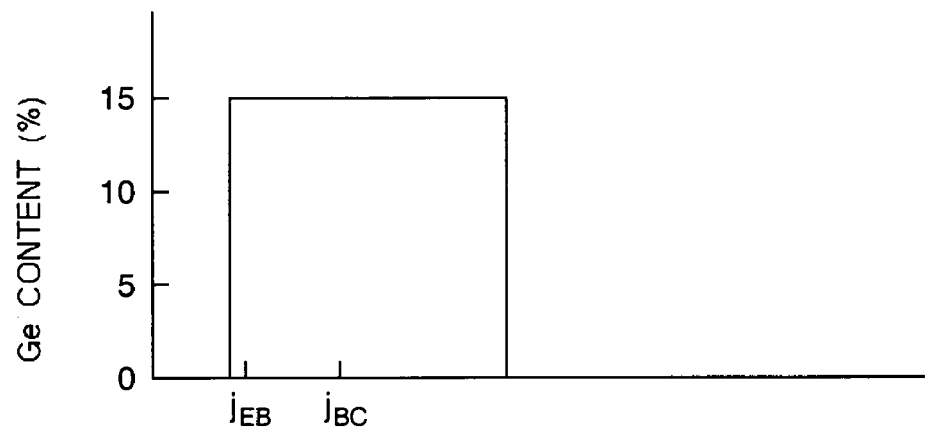
FIGS. 14A and 14B illustrate the distribution of impurities and germanium in the semiconductor device of the third embodiment.
Figure 14B:
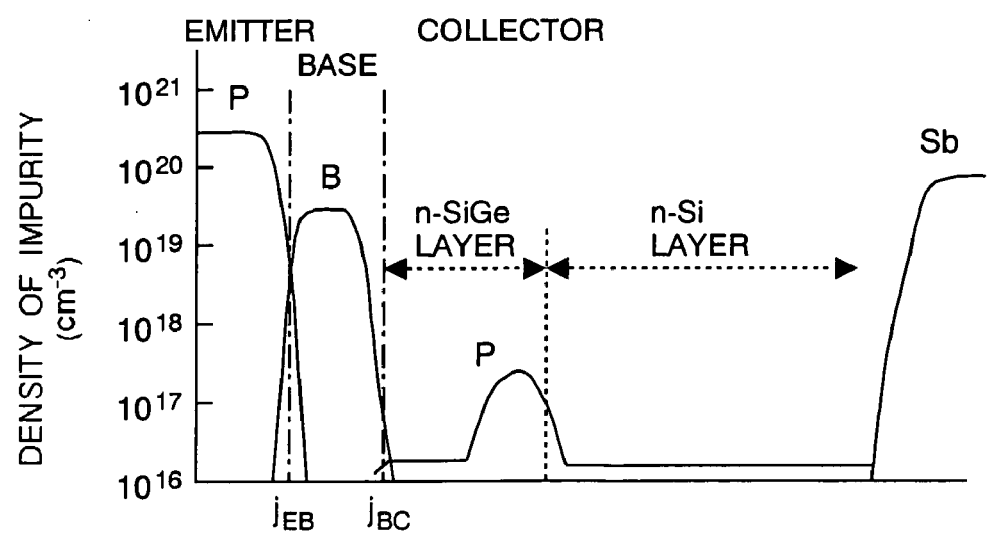

FIGS. 13 and 14 are respectively a sectional view of a semiconductor device according to a third embodiment of the present invention and a distribution diagram showing the distribution of impurities and germanium in a principal portion of the transistor. The axes of abscissa in FIGS. 14A and 14B are shown in a correlated manner to permit easier understanding of the correlation between Ge distribution and impurity concentration. Constituent portions shown in FIG. 13 are identified by the same reference numerals as in FIG. 2. The construction of a phosphorus doped region 18 in FIG. 13 is different from the construction shown in FIG. 2. This is a main different point. More specifically, in this embodiment, a peak value of phosphorus distribution is set so as to be positioned on the n-type silicon layer side with respect to the central part of the n-type silicon-germanium layer. By shifting the phosphorus distribution to the n-type silicon layer side, it is possible to hold the electric field in the vicinity of the heterointerface even if the accumulation of electrons in the depletion layer begins in the initial stage of KirK effect. Therefore, high current gain and cut-off frequency can be maintained up to a higher current than in the first embodiment. Besides, an increase of the electric field in the depletion layer caused by the addition of phosphorus can be made lower than in the first embodiment and a lowering of breakdown voltage can be prevented. However, the width of the depletion layer becomes narrower than in the first embodiment and the collector-base junction capacitance becomes large. This exerts an influence on high-speed characteristics such as the maximum oscillation frequency. Therefore, which of the first embodiment and this third embodiment is to be adopted is preferably determined according to for what purpose the transistor concerned is to be used. This embodiment may be adopted in combination with the second embodiment.

<Fourth Embodiment>

Figure 15A:
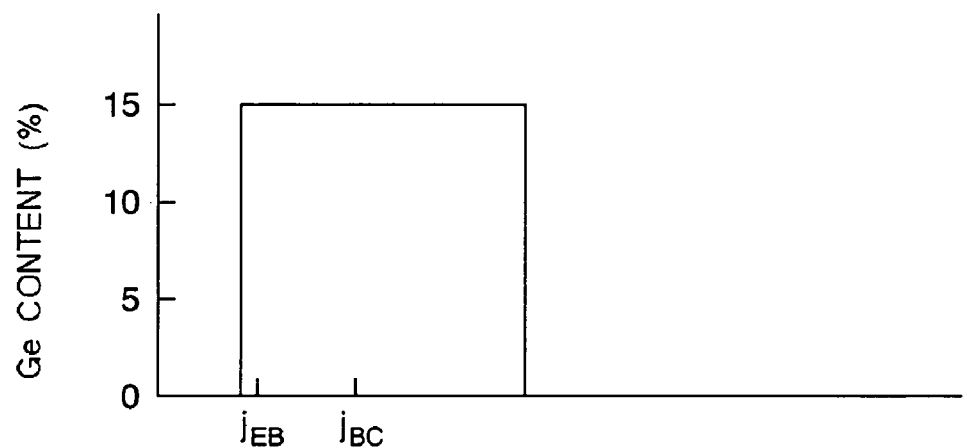
Figure 15B:
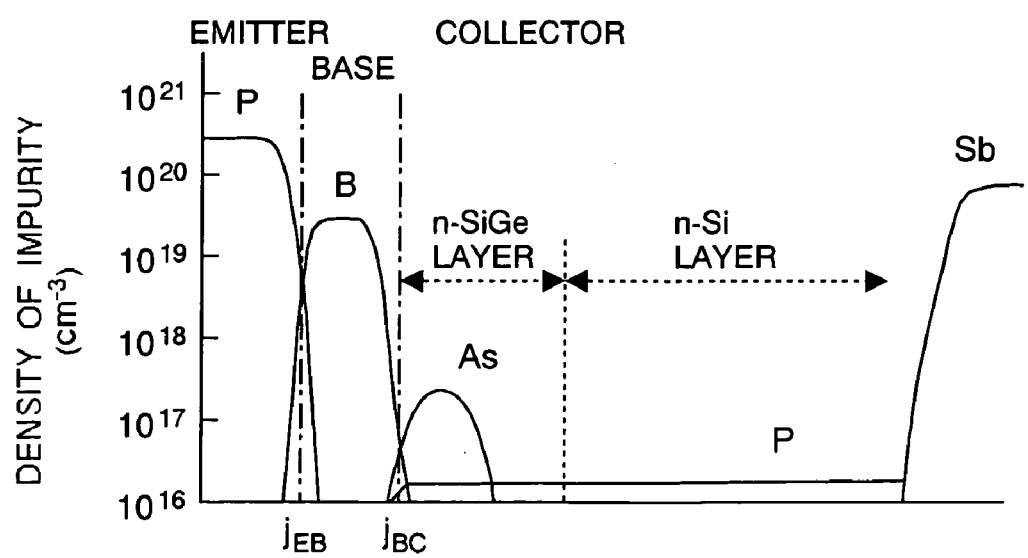

FIGS. 15A and 15B show a relation between Ge distribution (Ge content) and impurity concentration (density of impurity) in this embodiment. The axes of abscissa in both figures are shown in a correlated manner to permit easier understanding of the correlation between Ge distribution and impurity concentration. In this fourth embodiment, as shown in FIG. 15, arsenic is used as n-type impurity to be added into the n-type silicon-germanium layer. The distribution of arsenic doped by ion implantation can be made narrower than that of phosphorus and a change of distribution in heat treatment which is applied unavoidably in the course of process is smaller than that of phosphorus. This is advantageous in that the impurity distribution can be controlled more easily. In this embodiment, the distribution of arsenic may be in the vicinity of the base as in the first embodiment or may be in the vicinity of the heterointerface as in the third embodiment. Further, the distribution of germanium may be made such a gradient distribution as in the second embodiment.

<Fifth Embodiment>

Figure 16:
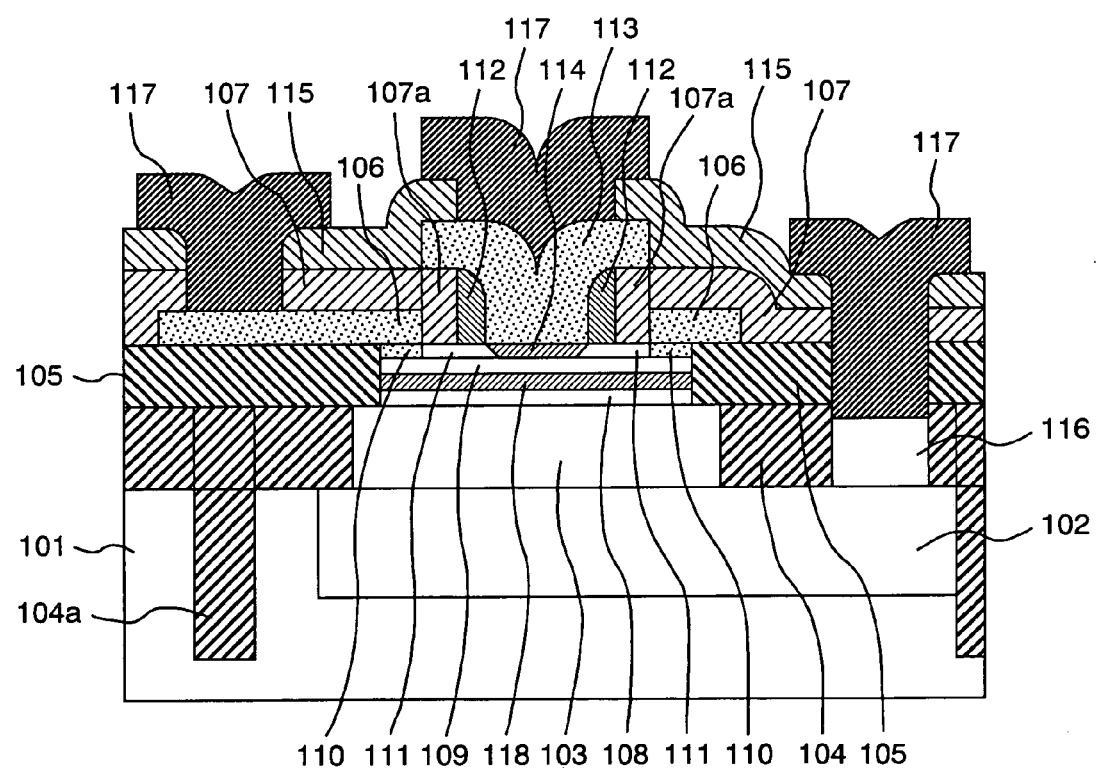
FIG. 16 is a sectional view of a semiconductor device according to a fifth embodiment of the present invention.

FIG. 16 is a sectional view of a semiconductor device according to a fifth embodiment of the present invention. In FIG. 16, constituent portions are identified by the same reference numerals as in FIG. 2. This fifth embodiment is characteristic in that an n-type impurity having the distribution shown in the first or the third embodiment is added simultaneously during epitaxial growth of the n-type silicon germanium layer. This corresponds to that, in FIG. 10D, the n-type silicon-germanium layer 8 already has the distribution of impurities and that of germanium shown in FIG. 1 or FIG. 11 or 14. This embodiment is advantageous in that the control of the impurity distribution is given a larger degree of freedom by performing the doping of impurity simultaneously with the growing process. Thus, this embodiment is effective to the case where there is the necessity of controlling the correlation between breakdown voltage and the working current region of transistor strictly under severe conditions. However, as shown in FIG. 16, an n-type region 118 of a high concentration comes to be included in the whole of intra-plane area of an n-type silicon-germanium layer 111. Thus, a decrease of breakdown voltage and an increase of collector-base junction capacitance may be likely to occur in comparison with the first embodiment.

Figure 17:
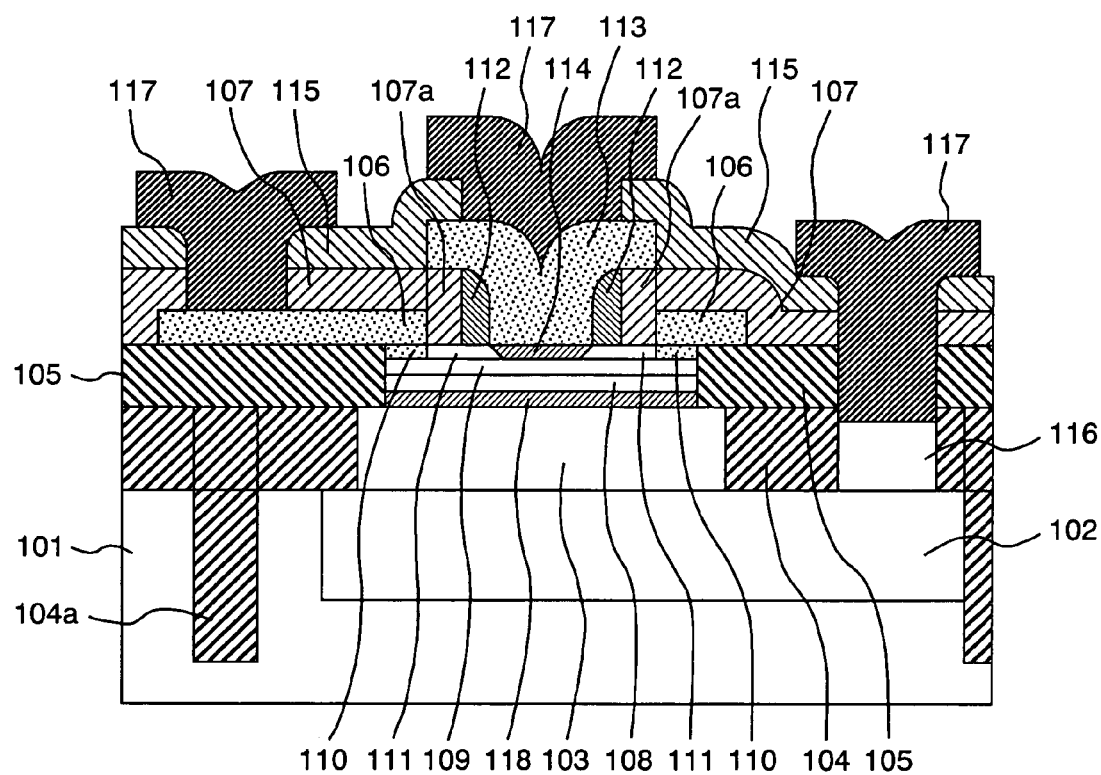
FIG. 17 is a sectional view showing another example of a semiconductor device included in the fifth embodiment.

The impurity distribution in this embodiment may be near the base as in the first embodiment or may be near the heterointerface as in the third embodiment. FIG. 17 is a sectional view showing another example of a semiconductor device included in the fifth embodiment. In FIG. 17, constituent portions are identified by the same reference numerals as in FIG. 2. The distribution of germanium may be made such a gradient distribution as in the second embodiment. Phosphorus and arsenic are employable as n-type impurities.

According to the above embodiments, in a so-called double heterobipolar transistor having two heterojunctions, an n-type impurity is distributed so as to have a peak in the n-type silicon-germanium layer, whereby the accumulation of electrons can be compensated also during the application of a high current. Moreover, the high breakdown voltage performance of the transistor can be maintained by distributing an n-type impurity in a restrictive manner to extend the collector-base depletion layer up to the n-type silicon layer. Consequently, the operation at a high current of the heterobipolar transistor having a high breakdown voltage performance, which operation has so far been impossible, becomes possible and thus both high speed performance and high breakdown voltage performance can be attained at a time.

According to the semiconductor device and the method of manufacturing the same in the present invention, in the heterobipolar transistor having a high breakdown voltage performance, an abrupt lowering of current gain and cut-off frequency during application of a high current can be suppressed while maintaining the high breakdown voltage performance of the transistor. Consequently, for example in a bipolar transistor for hard disk read/write IC which has a high breakdown voltage and for which a high-speed operation at a high current is required, it is possible to ensure a sufficient frequency band in high current operation and hence implement an IC which fully satisfies the required conditions.

Description of reference numerals used in this specification is as follows:

1, 101 . . . silicon substrate 2, 102 . . . n-type collector embedded layer of a high concentration 3, 103 . . . n-type first collector layer of a low concentration (single crystal silicon)

4, 4a, 104, 104a . . . element isolation insulator 5, 105 . . . collector-base isolation insulator 6, 106 . . . base lead-out electrode (p-type polycrystalline silicon of a high concentration or p-type polycrystalline silicon-germanium of a high concentration)

7, 7a, 107, 107a, 13, 113, 16, 116 . . . emitter-base isolation insulator 8, 108 . . . n-type second collector layer of a low concentration (single crystal silicon-germanium layer)

9, 109 . . . p-type base (single crystal silicon-germanium)

10, 110 . . . p-type external base layer (polycrystalline silicon-germanium)

11, 111 . . . single crystal silicon layer of a low concentration 13, 113 . . . emitter electrode (n-type polycrystalline silicon of a high concentration)

14, 114 . . . n-type emitter layer (single crystal silicon or single crystal silicon-germanium)

16, 116 . . . n-type collector lead-out layer of a high concentration 17, 117 . . . metal electrode 18 . . . n-type impurity implanted region 118 . . . impurity added region in the n-type second collector layer of a low concentration (single crystal silicon-germanium layer)

What is claimed is:

1. A semiconductor device comprising:
a semiconductor substrate;
a first semiconductor layer of a first conductive type embedded in said semiconductor substrate;
a second semiconductor layer of the first conductive type formed on said first semiconductor layer;
a third semiconductor layer of the first conductive type formed on said second semiconductor layer and made of a semiconductor material smaller in band gap than said second semiconductor layer;
a fourth semiconductor layer of a second conductive type formed on said third semiconductor layer; and
a fifth semiconductor layer of the first conductive type formed on said fourth semiconductor layer;
wherein an impurity concentration distribution in said third semiconductor layer has a peak of concentration within the third semiconductor layer, the value of said peak being higher than the impurity concentration in said second semiconductor layer.

2. A semiconductor device according to claim 1, wherein a bipolar transistor is constituted by using said first, second and third semiconductor layers as collector layers, said fourth semiconductor layer as a base layer, and said fifth semiconductor layer as an emitter layer.

3. A semiconductor device according to claim 2, wherein a collector-base depletion layer resulting from junction of said third and fourth semiconductor layers extends up to said second semiconductor layer.

4. A semiconductor device according to claim 1, wherein said first and second semiconductor layers are formed of single crystal silicon, said third and fourth semiconductor layers are formed of single crystal silicon-germanium or single crystal silicon-germanium-carbon, and said fifth semiconductor layer is formed of single crystal silicon or single crystal silicon-germanium or single crystal silicon-germanium-carbon.

5. A semiconductor device according to claim 2, wherein said first and second semiconductor layers are formed of single crystal silicon, said third and fourth semiconductor layers are formed of single crystal silicon-germanium or single crystal silicon-germanium-carbon, and said fifth semiconductor layer is formed of single crystal silicon or single crystal silicon-germanium or single crystal silicon-germanium-carbon.

6. A semiconductor device according to claim 3, wherein said first and second semiconductor layers are formed of single crystal silicon, said third and fourth semiconductor layers are formed of single crystal silicon-germanium or single crystal silicon-germanium carbon, and said fifth semiconductor layer is formed of single crystal silicon or single crystal silicon-germanium or single crystal silicon-germanium-carbon.

7. A semiconductor device according to claim 4, wherein said fourth semiconductor layer has a region in which the content of germanium decreases from the fourth semiconductor layer side toward said third semiconductor layer side.

8. A semiconductor device comprising:
a semiconductor substrate;
a first semiconductor layer of a first conductive type embedded in said semiconductor substrate;
a second semiconductor layer of the first conductive type formed on said first semiconductor layer;
a third semiconductor layer of the first conductive type formed on said second semiconductor layer and made of a semiconductor material smaller in band gap than said second semiconductor layer;
a fourth semiconductor layer of a second conductive type formed on said third semiconductor layer; and
a fifth semiconductor layer of the first conductive type formed on said fourth semiconductor layer;
wherein an impurity concentration distribution in said third semiconductor layer has a peak of concentration within the third semiconductor layer, the value of said peak being higher than the impurity concentration in said second semiconductor layer, and said third semiconductor layer has a region in which the band gap varies gradually within said layer so as to become larger toward said second semiconductor layer.

9. A semiconductor device according to claim 8, wherein a bipolar transistor is constituted by using said first, second and third semiconductor layers as collector layers, said fourth semiconductor layer as a base layer, and said fifth semiconductor layer as an emitter layer.

10. A semiconductor device according to claim 9, wherein a collector-base depletion layer resulting from junction of said third and fourth semiconductor layers extends up to said second semiconductor layer.

11. A semiconductor device according to claim 8, wherein said first and second semiconductor layers are formed of single crystal silicon, said third and fourth semiconductor layers are formed of single crystal silicon-germanium or single crystal silicon-germanium-carbon, and said fifth semiconductor layer is formed of single crystal silicon or single crystal silicon-germanium or single crystal silicon-germanium-carbon.

12. A semiconductor device according to claim 9, wherein said first and second semiconductor layers are formed of single crystal silicon, said third and fourth semiconductor layers are formed of single crystal silicon-germanium or single crystal silicon-germanium-carbon, and said fifth semiconductor layer is formed of single crystal silicon or single crystal silicon-germanium or single crystal silicon-germanium-carbon.

13. A semiconductor device according to claim 10, wherein said first and second semiconductor layers are formed of single crystal silicon, said third and fourth semiconductor layers are formed of single crystal silicon-germanium or single crystal silicon-germanium-carbon, and said fifth semiconductor layer is formed of single crystal silicon or single crystal silicon-germanium or single crystal silicon-germanium-carbon.

14. A semiconductor device according to claim 11, wherein said fourth layer has a region in which the content of germanium decreases from the fourth semiconductor layer side toward said third semiconductor layer side.

* * * * *